| United States Patent [19] | [11] Patent Number: 4,590,115 |
| Cassat | [45] Date of Patent: May 20, 1986 |

[54] METALLIZING OF PLASTIC SUBSTRATA

[75] Inventor: Robert Cassat, Ternay, France

[73] Assignee: Rhone-Poulenc Specialites Chimiques, Courbevoie, France

[21] Appl. No.: 449,183

[22] Filed: Dec. 13, 1982

[30] Foreign Application Priority Data

Dec. 14, 1981 [FR] France ................................ 81 23472

[51] Int. Cl.$^4$ ............................................... C25D 5/56
[52] U.S. Cl. ..................................... 428/174; 204/30; 204/38.4; 427/306; 427/437
[58] Field of Search ................. 204/20, 30, 38 B, ; 427/304, 305, 306, 437; 428/148, 174

[56] References Cited

U.S. PATENT DOCUMENTS

| | | | |
|---|---|---|---|
| 2,690,401 | 9/1954 | Gutzeit et al. | 204/30 X |
| 3,347,724 | 10/1957 | Schneble, Jr. et al. | 156/151 |
| 3,775,176 | 11/1973 | Cross et al. | 204/30 X |
| 3,865,699 | 2/1975 | Luch | 204/20 |
| 4,179,341 | 12/1979 | Sakano et al. | 204/20 |

OTHER PUBLICATIONS

*Chemical Abstracts,* vol. 76, No. 12, 63968m, p. 317, (Mar. 20, 1972).

*Primary Examiner*—John F. Niebling
*Assistant Examiner*—William T. Leader
*Attorney, Agent, or Firm*—Burns, Doane, Swecker & Mathis

[57] ABSTRACT

Plastic substrata are metallized, preferably by direct electrolytic metallization, by (i) providing a plastic shaped article comprising intimate admixture of a polymeric resin and a plurality of small metallic filler particles of a non-conductive oxide of a non-noble metal uniformly dispersed therethrough, at least one of the face surfaces of said shaped article having exposed thereon such high density of said metallic filler particles as to provide in step (ii) metallization growth nuclei adapted for direct electrolytic metallization; (ii) next subjecting said at least one face surface of said plastic shaped article to the action of a reducing agent to essentially quantitatively convert the non-conductive metal oxide filler particles to conductive free metal, metallization growth nuclei; and (iii) thence electrochemically and/or electrolytically metallizing the at least one reduced face surface of said plastic shaped article with a free metal deposit.

16 Claims, No Drawings

METALLIZING OF PLASTIC SUBSTRATA

BACKGROUND OF THE INVENTION

1. Field of the Invention:

The present invention relates to a process for the metallization of electrically insulating, plastic shaped articles, and, more especially, to the application of strongly adherent and ductile metallic deposits onto flexible or rigid plastic substrates, employing either electrochemical and/or electrolytic means. The invention also relates to the intermediate, semi-finished and final products manufactured in accordance with such process.

2. Description of the Prior Art:

It is known to this art that the face surfaces of plastic shaped articles can be covered by or coated with any metal (nickel, copper, chromium, silver, and the like), which provides same with a glossy (most frequently), matt or satin-like metallic appearance. The following properties are a direct result thereof: electrical surface conductivity (which paves the way for major applications in the field of printed circuits); special surface appearance (which leads to applications for producing decorative elements and light reflectors, for imparting a particularly uniform surface condition or for providing good mold-release properties); improvement of surface hardness and of abrasion resistance (which leads to applications for producing plastic molds, especially for use in the foundry field for fabricating sand cores); resistance to corrosion and chemical attack of certain plastics; much reduced, or even zero, permeability to gases and vapors; thermal conductivity (which leads to applications for more easily dissipating heat from a plastic part, accompanied, as a result, by increased thermal stability and by a definitely higher heat-deformation temperature of the plastic); and the possibility of joining by welding the metallized article to one or more other objects, either made of metal or metallized plastic. The cost of production of the metallized article is typically less than that of the same object produced from whatever other metallic material. In fact, the finished plastic article is obtained upon removal thereof from the molding device (by pressing, casting, etc.) and thus is immediately ready for coating treatments.

And over the period of time of about the last two decades, considerable work has been carried out on solving these problems encountered in the coating with metal of electrically insulating substrates, such as polymeric resins, whether reinforced or not. Conventionally, metallization comprises three basic steps: (i) a surface preparation step, (ii) a sensitization and activation step and (iii) a metallization step by electrochemical means. In the surface preparation, the essential operation consists of oxidative acid pickling (or stripping), which attacks or affects the resinous surface such as to create micropores in order to promote the eventual adhesion of metallic particles thereto, which will serve as primer sites for the development of the electrochemical metallization; this operation is effected by immersion for a few minutes in a concentrated aqueous chromato sulfuric acid solution; (it should be noted that this is a rather costly process, owing to the destruction of chromic acid, which is converted by reduction to chromium (III) oxide). The subsequent sensitization and activation operations have as their object forming a discontinuous outer coating of metallic particles (or primer sites), from which, in the following step, a thin metallic coating will be produced electrochemically; sensitization can be effected by immersion in an acid solution of stannous salts; activation which follows the sensitization consists of dipping the article in an aqueous solution of a salt of a noble metal of Groups IB and VIII of the Periodic Table, (as listed in the publication *Handbook of Chemistry and Physics,* 45th edition, 1964–1965), usually palladium. Sensitization and activation can also be effected in a single phase by dipping the insulating substrate, for example, in an acid solution; containing both tin salts and palladium salts; this solution is the basis of an oxidation/reduction reaction between the tin and the palladium, leading to the formation of colloidal palladium, which is adsorbed on the substrate. The subsequent electrochemical metallization step (also deemed the "electroless method") consists of subjecting the thus activated substrate to the action of a metallization bath, which is an aqueous solution comprising, in particular, a water-soluble salt of the metal to be deposited and a reducing agent capable of converting the metal salt to free metal. The quality of the metallization, particularly the adhesion of the deposited metal, depends on the degree of adsorption of the metallic priming (palladium); the quality of metallization thus is closely linked to the face surface condition of the insulating substrate. Those skilled in the art that wish to employ this technique cannot, with a view towards simplification, dispense with the previous surface treatment, which is important. Moreover, they may face in this step, and also in the later sensitization and activation step, a problem of degradation of the resin in contact with the acid baths utilized. It should moreover be noted, in the sensitization and activation step, that they may also face the problem of insufficient wettability of the resin, which will hinder the contact of the bath or baths used with the substrate. Finally, the technique immediately above-described comprises numerous steps and, in addition, it is not free from shortcomings. Reference has thus far been made to three steps, but there is a fourth step, which consists of reinforcing, if required, the metal coating obtained by subsequent electrolytic metallization; this is especially the case when it is desired to provide a thick metallic coating. Electrochemical metallization is, moreover, a slow method, the rate of deposition of which is on the order of 1 $\mu$m per hour; it is therefore quite useless when it is sought to provide metallic coatings, the thickness of which is to exceed approximately 20 $\mu$m. In order to obtain such thick coatings, the procedure is generally to begin by effecting electrochemical deposition on the order of several $\mu$m, for example, and then to carry out a second deposition electrolytically. The electrolytic method is incomparably faster, since its rate of deposition is on the order of about 50 $\mu$m per hour. It too should be noted, and this circumscribes another disadvantage and drawback of the conventional technique hereinbefore outlined, that electrolytic metallization cannot properly be carried out immediately after the substrate activation step, this being due to the fact that the resulting discontinuous surface of metallic particles is not sufficiently conductive such that it is necessary, in this instance, to resort to electrochemical deposition in order to provide the required electrical conductivity.

The possibility of providing metallic primer sites on the substrate much more simply has been suggested in U.S. Pat. No. 2,690,401 which proposes the introduction into the resin, as a filler, of fine metal particles, such as, for example, aluminum particles. However, these finely divided metal particles are particularly sensitive to oxidation and same are thus rapidly covered with a non-conductive oxide layer, when exposed to air, especially during the production of the substrate; it is therefore generally appropriate to subject the face surface to be metallized, prior to any such metallization, to a gentle pickling action (generally by an acid method) such as to restore the desired values of electrical conductivity. The use of noble metals certainly eliminates the risks of oxidation, but in the majority of cases, some are too costly to be adapted for advantageous industrial application. It too has been proposed, for minimizing the risks of oxidation, to employ (non-noble) metal particles of larger dimensions. In that case, however, the same concentration by weight of metallic filler in the substrate leads to a lower surface density of primer sites and electrochemical growth will take place in modular fashion without any continuity. Finally, the distribution in the resinous substrate of metal particles in sufficient quantity for yielding a surface density of primer sites which is compatible with continuous electrochemical growth, rules out the use of this technique for the manufacture of printed circuits, since conductive bridges can result in the substrate mass thus filled.

To avoid this difficulty, it is possible to employ the technique described in U.S. Pat. No. 3,347,724 which consists of preparing a substrate filled with fine particles of non-conductive cuprous oxide and in subjecting, immediately prior to the metallization step, the surface areas of the substrate desired to be metallized, to reduction by acid treatment, such as to convert the cuprous oxide to metallic copper. It is also known, though, that reduction of cuprous oxide by acid gives rise to the formation of an unstable cuprous salt, which undergoes a change to provide, on the one hand, a cupric salt and, on the other hand, metallic copper, which is liberated according to the reaction:

$$Cu_2O + 2H^+ = Cu^{++} + Cu + H_2O$$

In a reduction of this type the yield of metallic copper is much lower than 50%; in fact, only half of the starting copper is capable of being converted to metallic copper and, furthermore, a portion of this reduced copper is dissolved by the acid agent employed. The result is that the density of metallic primer sites per unit surface which can be obtained is quite limited. It is certainly adequate enough to be followed by electrochemical metallization, but it is insufficient for direct metallization by the electrolytic method. In fact, this patent indicates that it is difficult or even impossible to effect metallization by electroforming. This technique thus reflects the same disadvantage as that mentioned in connection with the conventional technique outlined above which consists, for producing thick metallic deposits, of having to carry out two successive metallization steps, one by an electrochemical method and then a second one by an electrolytic method.

Cf. U.S. Pat. Nos. 3,226,256 and 3,764,280; *Chemical Abstracts*, 76, No. 12, 63968 m, page 317 (March 20, 1972); *Chemical Abstracts*, 94, No. 12, 9482 n, page 742 (Mar. 23, 1981); and German Pat. No. 2,141,759.

SUMMARY OF THE INVENTION

Accordingly, a major object of the present invention is the provision of improved process for the metallization of plastic shaped articles which improved process is characterized by its manifest simplicity (no sensitization and activation, no gentle pickling of the metallic filler incorporated into the substrate), and by its low cost (no use of palladium salts or of salts of pulverulent noble metals), and which otherwise enables obtainment; prior to any metallization, of a high density of primer sites, thus enabling electrolytic metallization to then be directly carried out, without the requirement for a first electrochemical deposition, and which improved process too is applicable to the manufacture of all desired final products, especially printed circuits.

Briefly, the present invention features a process for the metallization of plastic substrates, in accordance with which a substrate of suitable shape is first produced, which comprises intimately admixing and shaping a polymeric resin with at least one filler adapted to provide metallic primer sites on the face surfaces of the resultant shaped article for metallization, and deposition of the desired metallic coating is then carried out or propagated from such primer sites, said process being characterized in that:

(i) the filler adapted to provide the metallic primer sites comprises a non-conductive oxide, derived from a non-noble metal;

(ii) the face surface or surfaces destined to receive, in whole or in part, the metallic coating is (are) subjected, prior to any metallization, to the action of a reducing agent, which is specially selected, on the one hand, for its ability to quantitatively convert the metal oxide to conductive free metal and, on the other hand, for easy control over the extent of the reduction performed;

(iii) the proportions of metal oxide and the conditions of the reduction are such as to provide a high density of metallic primer sites, such as to be adapted to at least for direct electrolytic metallization; and (iv) the deposition of the metallic coating is carried out by an electrochemical and/or electrolytic method.

DETAILED DESCRIPTION OF THE INVENTION

More particularly according to the present invention, in the subject process for the metallization of plastic substrates, the filler adapted to provide the metallic primer sites preferably comprises cuprous oxide, and the reducing agent preferably comprises a borohydride.

Another object of the present invention is the provision of intermediate or semi-finished articles resulting from carrying out the subject process, said shaped articles comprising the substrates formed by the intimate admixture and shaping of a polymeric resin with at least one filler based on a non-conductive oxide, derived from a non-noble metal, present in adequate proportions, such substrates having been subjected, either entirely or over a portion of the face surface or surfaces which are to be metallized, to the action of a reducing agent especially selected such as to provide a high density of metallic primer sites, or growth nuclei particulates, the same being adapted at least for direct electrolytic metallization. More exactly, by the aforesaid definition there is intended a substrate, the reduced region of which, prior to metallization, displays a surface resistivity ranging from about 0.01 $\Omega/\square$ to about $10^3$ $\Omega/\square$.

Yet another object of the present invention is the provision of final product metallized substrates prepared according to the subject process. These metallized substrates can be metallized objects useful in a wide variety of industrial applications, e.g., automotive: frames of speedometers, of radios, of door handles, of window handles, of radiator grills, of various dashboard buttons, of headlights, of tail lights, of various signals, etc.; radio, television and electronics: casings and frames of radio and television sets, conductor filaments, printed circuits and various buttons; sanitary and household articles: handles for doors and windows, various accessories for sanitary and household devices; articles belonging to the field of aerospace technology.

Whether the resistivity values desired for the substrate are obtained, prior to metallization, will depend, on the one hand, on the proportions of oxide contained in the substrate and, on the other hand, on the extent of the reduction.

In general, the proportions of the ingredients of suitable substrate according to the present invention are selected within the following limits (expressed in percentage by weight of each of the ingredients in the substrate):

(i) from 25% to 90% of non-conductive oxide,
(ii) from 0% to 50% of other filler(s), and
(iii) from 10% to 75% of polymeric resin.

With respect to the oxide employed, same should be present in the form of particles having small dimensions; the particle size distribution typically ranges from 0.1 to 5 82 m.

In addition to the oxide particles, the substrate may contain one or more other fillers which are completely inert under the conditions of reduction. Particularly representative are the reinforcing fillers, such as, for example: materials comprised of simple fibers of inorganic or organic type, the length of which generally does not exceed 10 mm, such as, in particular, fibers of asbestos, ceramics or, preferably, of glass or reinforcing materials of great length: threads, cloths, non-woven or knitted fabrics; materials comprised of grains of inorganic or organic type, having a particle size distribution ranging from 20 μm to 5 mm, such as particles of mica, molybdenum sulfide, aluminum oxide, silica or polytetrafluoroethylene or, preferably, glass microspheres.

The resins, in which the metal oxide particles, but also the other filler or fillers, when present, are uniformly dispersed, can be thermoplastic resins, thermosetting resins, elastomers and mixtures of these resins with one another. It should be noted that the use of thermosetting resins or of mixtures containing them is particularly advantageous for imparting good heat resistance to the substrate.

The following are exemplary, in particular, of representative thermoplastic resins: resins of the polyolefin type, illustrated, for example, by polyethylene, polypropylene and ethylene/propylene copolymers; resins of the vinyl type, illustrated, for example, by polyvinyl chloride, polyvinylidene type, illustrated, for example, by the reaction products of hexamethylene diisocyanate and 1,3-propanediol or 1,4-butanediol; and resins of the saturated polyester type, illustrated, for example, by polyethylene glycol terephthalate or polybutylene glycol terephthalate.

The following are exemplary, in particular, of representative thermosetting resins: resins of the phenolic type, illustrated, for example, by the condensates of phenol, resorcinol, cresol or xylenol with formaldehyde or furfural; resins of the unsaturated polyester type, illustrated, for example, by the reaction products of an anhydride of an unsaturated dicarboxylic acid, such as maleic or citraconic anhydride, with a polyalkylene glycol; resins of the epoxy type, illustrated, for example, by the reaction products of 1-chloro-2,3-epoxypropane or 1,2,3,4-diepoxybutane with bisphenol A or other phenols, such as resorcinol, hydroquinone or 1,5-dihydroxynaphthalane: resins of the polyimide type, illustrated, for example, by the reaction products of an oligoimide, derived from an unsaturated dicarboxylic acid, with a primary polyamine and, possibly, a suitable adjuvant.

Representative of the elastomers are, inter alia, natural or synthetic rubbers, silicones, polyurethanes, etc.

As usual, the preparation of the substrate to be metallized consists of intimately admixing, in a manner per se known to the art, the resin with the filler (oxide and, possibly, inert filler(s)). If the resin is liquid under the conditions of temperature selected for this mixing operation, the uniformity of the mixture can be improved by passage over a roller. If the resin is solid, it is recommended to mill the mixture as well. In the case of the thermosetting resins, the polymer material used at the outset for preparing the mixture is generally in the prepolymer state (a material having a certain softening point and still being soluble in certain solvents). It should be noted that, in the finished substrate, as used for metallization, the thermosetting resin is then in the completely cross-linked state (the material is non-melting and entirely insoluble). The filled resin (in the case of thermoplastic resins) or the filled prepolymer (in the case of thermosetting resins) can be used in the liquid mass state for producing the desired article by simple hot-casting into a mold of suitable shape. It can also be used in powder form for carrying out the molding by extrusion or injection (preferably in the case of thermoplastic resins), or by compression or transfer (preferably in the case of thermosetting resins), or, otherwise, by sintering. As regards thermosetting resins, it has been noted above to mix the filler with the separately prepared prepolymer, but the prepolymerization can also be effected in the presence of the filler. Still as regards the thermosetting resins, it is suitable to subject the shaped article obtained, after molding, to hardening: supplementary shaping can be effected during this hardening process. As is well known, hardening takes place with the aid of a catalyst or a hardener, preferably added at the time of molding, or, alternatively, under the action of heat or, alternatively, under the joint action of a catalyst or hardener and of heat.

Preferably, the thermoplastic resin employed for carrying out the invention is a polyamide resin of nylon 66, 6 or 11 type.

Also preferably, the thermosetting resin employed is an epoxy type resin, obtained by the reaction of 1-chloro-2,3-epoxypropane or 1,2,3,4-diepoxybutane with bisphenol A, or is a polyimide type resin, obtained by the reaction between a N,N'-bis-imide of an unsaturated dicarboxylic acid and a primary polyamine, according to French Pat. No. 1,555,564, U.S. Pat. Nos. 3,562,223 and 3,658,764 and U.S. Pat. No. Re 29,316, hereby expressly incorporated by reference. The polyimide resin selected may alternatively be obtained by the reaction between the bis-imide, the polyamine and various adjuvants, such as, for example, mono-imides (according to French Pat. No. 2,046,498), monomers other than imides, containing one or more polymerizable groups of the $CH_2=C$ type (according to French Pat. No. 2,094,607), unsaturated polyesters (according to French Pat. No. 2,102,878) or hydroxylated organosilicon compounds (according to French Pat. No. 2,422,696), also hereby expressly incorporated by reference. In the case where such adjuvants are used, it will be appreciated that the polyimide resin in the prepolymer state can be either the reaction product of a bis-imide, a polyamine and an adjuvant, or the reaction product of a prepolymer of a bis-imide and of a polyamine and an adjuvant, or, again, the mixture of a prepolymer of a bis-imide and of a polyamine and an adjuvant.

As regards the epoxy type resin, hardening takes place with the aid of a hardener belonging to the following groups: anhydrides such as, for example, phthalic anhydride, tetrahydrophthalic anhydride or maleic anhydride; simple aliphatic or aromatic amines, polyamines, amides or even aminoplast resins, such as, for example, triethanolamine, diethylenetriamine, triethylenetetramine, dicyanodiamide or a melamine/formaldehyde resin; various hardeners such as, for example, phenolic prepolymers, polyimide prepolymers such as those mentioned above, boron fluoride or tin tetrachloride. As regards the polyimide type resin, hardening takes place generally under the action of heat, but it can be advantageous to accelerate same by the use of a radical polymerization initiator, such as, for example, dicumyl peroxide, lauroyl peroxide, azobisisobutyronitrile, or of an anionic polymerization catalyst, such as, for example, diazabicyclooctane. The hardener or the catalyst used can be added to the resin as a mixture with the filler, but it is preferably introduced after the incorporation of the filler. The quantities used, which vary widely, are well known to those skilled in the art and are in no way critical. It is useful to point out that the amounts given above concerning the proportions by weight of polymer resin, forming part of the composition of the substrates according to the invention include the quantity of hardener or catalyst which may be used.

Depending upon the physical properties of the resin used and depending also on the molding technique employed, it is possible that the filler, particularly the metal oxide, is completely coated with the polymeric material. In that case, it is recommended to treat the surface with the aid of a mild chemical agent, for example, which attacks only the outer surface of the resin, without contacting the oxide, or, preferably, with the aid of mechanical means, such as sandblasting, sandpapering, grinding, filing, etc., such as to bring the oxide particles to the surface before proceeding with the reduction treatment. It should be noted that when a part is made by sintering, by drawing or by extrusion, the oxide particles in the surface are generally not completely coated with the resin; surface cleaning is then not necessary.

It has also been noted above that the surface resistivity that it is desired to obtain, prior to metallization, will depend, apart from the composition of the substrate, on the extent of the reduction carried out. Accordingly, the nature of the reduction step effected prior to metallization will now be more fully discussed.

It has been observed that the conversion of cuprous oxide to metallic copper can be carried out easily and quantitatively by the action of borohydrides. The conversion is represented by the reaction:

$$4Cu_2O + BH_4^- = 8Cu + B(OH)_3 + OH^-$$

The ease of this reaction is likely due to the catalytic effect of metallic copper, which could be explained by the intermediate formation of unstable copper hydride.

The borohydrides that are useful in the present invention include substituted borohydrides as well as unsubstituted borohydrides. Substituted borohydrides in which at most three hydrogen atoms of the borohydride ion have been replaced by inert substituents, such as, for example, alkyl radicals, aryl radicals or alkoxy radicals, are exemplary. Preferably, alkali metal borohydrides are employed, in which the alkali metal cation is sodium or potassium. Typical examples of suitable compounds are: sodium borohydride, potassium borohydride, sodium diethylborohydride, sodium trimethoxyborohydride and potassium triphenylborohydride.

The reduction operation is carried out in a simple manner by bringing the part, or shaped article, after molding, into contact with a solution of borohydride in water or in a mixture of water and an inert polar solvent, such as, for example, a lower aliphatic alcohol. Preferred are purely aqueous borohydride solutions. The concentration of these solutions can vary over wide limits and preferably ranges from 0.05 to 1% (by weight of active hydrogen of the borohydride in the solution). The reduction can be carried out at elevated temperature; however, it is preferred to carry out same at a temperature of about ambient temperature, for example, from 15° C. to 30° C. Concerning the course of the reaction, it will be appreciated that it gives rise to $B(OH)_3$ and to $OH^-$ ions, the effect of which is to cause an increase in the pH of the medium over the course of the reduction. Now, at high pH values, for example above 13, the reduction slows down, such that it can be advantageous to work in a buffered medium, as to provide a well regulated reduction velocity.

At the beginning of the reduction, the reaction concerns essentially the cuprous oxide grains, which are present at the surface of the substrate and which are in direct contact with the reducing agent. As a result of the catalytic effect of the metallic copper, the reduction reaction will then continue into the depth of the substrate and this even though the resins used do not possess any particularly marked hydrophilic character. Easy control of the extent of the reduction is therefore made possible mainly by adjusting the duration of the reduction operation. In order to obtain a resistivity corresponding to the desired values, the period of treatment required is generally rather short and, depending upon the proportions of oxide contained in the substrate it usually ranges from about one minute to fifteen minutes. For a given treatment period, it is possible to influence the reduction rate again by adding to the medium diverse accelerators such as, for example, boric acid, oxalic acid, citric acid, tartaric acid or metal chlorides such as the chlorides of cobalt (II), nickel (II), iron (II), manganese (II) and copper (II).

The reduction, which is carried out for the time interval indicated above, may extend only into a portion of the depth or thickness of the substrate, or it may extend completely therethrough. Apparently, such extent is wholly dependent upon the depth or thickness of the substrate and the duration of the reduction treatment. It will thus be seen that, when the substrate is thick and when it is desired to extend the reduction through a major portion or completely through the thickness thereof, a treatment period greater than that indicated above may be required. In general, the period indicated above is always sufficient for developing a resistivity corresponding to the desired values. It should be noted that, for electrical or electronic applications, care should be taken to reduce only a portion of the depth or thickness of the substrate, such as to maintain insulating, non-reduced inner portion or layer, in order to avoid any stray phenomenon of conductive bridging.

In view of the finely divided state of the copper obtained after the reduction treatment, it was to be expected that its oxidation in air would be rapid. Contrariwise, it has been observed that this indeed is not the case at all, and the level of the surface resistivity of the substrate after reduction does not change even after several days of storage in ambient air.

Following the reduction treatment, the substrate is metallized by deposition thereon of a coating of copper, nickel or some other metal. This metallization can be carried out electrochemically, but it has been observed, and this constitutes one of the essential advantages of the present invention, that it can also be carried out directly by an electrolytic method. It is not unusual, in certain applications, to seek a metallic layer deposit of at least about 20 μm; therefore, the option of employing a direct electrolytic method results in a considerable timesaving. It is thus possible to carry out, conventionally, first an electrochemical metallization and then to reinforce the first deposit by a subsequent electrolytic deposit.

Electrochemical metallization is carried out by immersion of the substrate, after reduction, in an aqueous acid or alkaline solution, containing a water-soluble salt of the metal or metals to be deposited and a reducing agent. In acid solution, a buffer is used, such as a water-soluble salt derived from a carboxylic acid and having an ionization constant, pKa, in water which is above 4, such as, for example, acetic acid, butyric acid or propionic acid. In alkaline solution, a reagent such as ammonium chloride or ammonium hydroxide is used for maintaining an alkaline pH. Nickel is generally used as the metal for electrochemical deposition. Other metals, such as, for example, cobalt, chromium, copper, iron, silver, gold, vanadium, cobalt/nickel alloys and brass can also be deposited. For use with nickel, a reducing agent such as sodium hypophosphite is recommended. There are other electrochemical reducing agents and these are well known to the art. For a more detailed description of the working conditions suitable for electrochemical metallization, reference is made to *Encyclopedia of Polymer Science and Technology*, Volume 8, pages 658 to 661 (1968). The proportions of the ingredients of the electrochemical bath, the period of immersion of the substrate, the temperature and the other working conditions are determined for each particular case in a manner that is known per se, such as to provide the best results.

Metallization by electrolysis is equally well known; cf., in particular, *Encyclopedia of Polymer Science and Technology*, Volume 8, pages 661 to 663 (1968). The suitably reduced substrate constitutes the cathode and the metal to be deposited the anode. Both are dipped into an electrolyte, through which a current is passed. For example, in the case of electrolytic copper-plating, the deposited copper can be monovalent or bivalent and originates from a cyanide electrolyte (monovalent copper) or from an electrolyte based on a sulfate, pyrophosphate or fluoborate (bivalent copper). Several adjuvants can be added to the electrolyte: an alkali metal salt or alkaline earth metal salt, an acid (acid copper sulfate copper-plating bath) or a base (alkaline stannate tin-plating bath) for increasing the conductivity of the electrolyte; a buffer reagent for avoiding rapid variations in pH; and substances that modify the structure of the electrodeposits, such as, for example, colloids, surface-active agents, a phenol, a sulfonated phenol, an inorganic or organic brightening agent, or a levelling agent, such as, for example, coumarin. The quality of the electrodeposit, whether a metal or a metal alloy, will depend upon the composition of the electrolyte and on the physical conditions of the electrolysis (temperature, cathodic and anodic current density, distance between anode and cathode, surface conditions of the electrodes, etc.); these different parameters will be regulated in each particular case in manner that is also known per se.

The possibility of extending the reduction into the depth or thickness of the substrate will enable the following advantages to be obtained: there will be, during metallization, a deep anchoring of the deposited metal in the resinous substrate; in the case of welding with addition of metal forming an alloy, the alloy can evenly migrate into the interior of the substrate, since there is real continuity of the copper into the depth of the substrate; and in the case of metallization intended to function as a thermal drain, it will be possible to influence the heat transfer of the resin by extending the reduction more or less into the substrate mass.

It will be understood that modifications can be made to the embodiments that have been described above, especially through substitution of equivalent means, for example, concerning the non-noble metal oxide that can be used, without departing from the ambit of the present invention. Thus, cuprous oxide can be replaced by other non-noble metal oxides, the degree of oxidation of which is selected such as to enable easy reduction of the oxide by the borohydride and which are capable of intermediate formation of unstable metal hydrides; oxides that are suitable are, for example, nickel (II) oxide, cobalt (II) oxide, lead (II) oxide, cadmium (II) oxide, chromium (III) oxide, antimony (III) oxide and tin (IV) oxide.

In order to further illustrate the present invention and the advantages thereof, the following specific examples are given, it being understood that same are intended only as illustrative and in nowise limitative.

EXAMPLE 1

A mixture was prepared dry from 70 parts by weight of cuprous oxide, the grains of which displayed a particle size distribution ranging from 0.5 to 3 μm and 30 parts by weight of a powder, having a particle size distribution of below 30 μm, of a prepolymer prepared from N,N'-4,4'-diphenylmethane-bis-maleimide and 4,4'-diamino-diphenylmethane (molar ratio bis-imide/diamine: 2.5), having a softening point of 105° C. This admixture, into which 0.3 part of dicumyl peroxide was also incorporated, was passed through a blade mill CNTA for establishing uniformity.

54 g of the resulting milled mixture were taken and pelleted under cold conditions at $200 \times 10^5$ Pa to provide a disk of 50 mm in diameter. This disk was then introduced into a mold, $100 \times 100$ in size and preheated to 180° C. A temperature of 200° C. was then set on the heat regulator of the press and the piston of the mold was progressively depressed under its own weight in proportion to the flow of the polymeric material. After 7 minutes following termination of the natural descent of the piston, the pressure was increased to $200 \times 10^5$ Pa and maintained at that value for 15 minutes. Mold release was then carried out while hot.

A plate, having the shape of a parallelipiped and the dimensions, $100 \times 100 \times 2$ mm, was obtained in this manner. Said plate, after cooling, was polished on its two large face surfaces with a soft abrasive paper (paper 600) and it was cut into four squares of 45 mm sides.

These square articles (or samples) were then cleaned of dust by ultrasonic cleaning for several minutes in a water bath, and then dipped for 5 minutes into an aqueous solution of sodium borohydride, having a concentration of 1% by weight. The solution of reduction was at ambient temperature, i.e., about 20° C., and it was stirred. After 5 minutes of treatment, the resultant square articles displayed surface resistivities of less than 1 $\Omega/\square$. The reduction was carried out to a substrate depth on the order of several $\mu m$.

Electrolytic copper-plating was then carried out in an electrolyte containing:

| | | |
|---|---|---|
| (i) Copper sulfate ($CuSO_4.5H_2O$) | 75 g/l | |
| (ii) $H_2SO_4$ | 10 g/l | |
| (iii) Chloride ($Cl^-$) | 50 mg/l | |
| (iv) Additive for acid sulfate copper-plating bath, marketed by Rhone-Poulenc under the trademark RP 500 ® | 5 ml/l | |

The RP 500 additive enabled bright, ductile, leveling copper deposits to be obtained, which were without internal stress.

The electrolysis conditions were the following:

| Sample | Temperature °C. | Current density A/dm$^2$ | Period in minutes |
|---|---|---|---|
| 1 | 20 | 5 | 5 |
| 2 | 20 | 2.5 | 5 |
| 3 | 20 | 3 | 15 |
| 4 | 20 | 3 | 60 |

Samples 1 to 4 evidenced uniform copper-plating. Samples 1, 2 and 3, after rinsing and drying, were passed into a tin/lead bath; same were covered with a uniform layer of bright alloy. Sample 4 was cut up and a section was examined under a microscope after being polished; the resulting electrodeposit of copper was very uniform and it had a thickness of 47 $\mu m$.

EXAMPLE 2

A mixture was prepared dry from cuprous oxide and the polyimide prepolymer described in Example 1, the mixture comprising 50 parts by weight of each constituent. 0.5 part by weight of dicumyl peroxide and 43 parts by weight of glass fibers, having an average length of 6 mm, were then incorporated into this admixture. All of the materials were then homogenized in TURBULA ® apparatus.

60 g of the composition thus obtained were taken. This fraction of the composition was pelleted and then hot-pressed in the manner indicated in Example 1. The plate obtained, having the dimensions 100×100×2 mm, was then surface-cleaned by sandblasting with a siliceous sand of about 80 mesh and was then cut into four square samples of 45 mm sides. The samples were carefully rinsed with water under pressure and then treated at 20° C. with an aqueous solution of potassium borohydride, having a concentration of 5% by weight. The duration of the reduction was 1 minute. The reduced samples had surface resistivities on the order of several hundred $\Omega/\square$. The reduction extended into the substrate to a depth on the order of 1 $\mu m$.

Finally, electrolytic copper-plating was carried out, using the same electrolyte as that described in Example 1. The electrolysis conditions were the following: Sample Temperature Current density Period in

| Sample | Temperature °C. | Current density A/dm$^2$ | Period in minutes |
|---|---|---|---|
| 1 | 20 | 2.5 | 1 |
| 2 | 20 | 2.5 | 2 |
| 3 | 20 | 5 | 1 |
| 4 | 20 | 5 | 30 |

After 1 minute, under 2.5 A/dm$^2$, the deposit was not continuous at the surface and there were some uncovered points on the sides (Sample 1); after 2 minutes, the surface deposit became continuous and the sides were uniformly coated with copper (Sample 2). Under 5 A/dm$^2$, the deposit was already continuous on the surface and sides after 1 minute (Sample 3). Sample 4 evidenced uniform copper-plating.

EXAMPLE 3

Another fraction of the composition (100 g) prepared in Example 2 was used for molding on a slightly conical steel insert (length: 50 mm; maximum diameter: 9.5 mm; minimum diameter: 9 mm). For this purpose, half the composition was placed into a cold mold having the dimensions 50×35×35 mm, and then the metal piece was placed onto the composition and covered with the second half of the composition. The mold, heated to 200° C., was pressed under 200×10$^5$ Pa for 30 minutes and then reheated for 24 hours at 200° C. After removal from the mold, the insert was extracted with a pin-punch and the piece was again drilled in the recess axis with a drill of 10 mm.

The piece was then dipped for 15 minutes at 20° C. into an aqueous solution of sodium borohydride, having a concentration of 3% by weight and buffered to pH 12.

An electric junction was placed at the top of the recess and the piece was dipped into the electrolysis bath in accordance with Example 1 in such manner that the electrode was not in contact with the electrolyte. Deposition of copper was effected under 1 A/dm$^2$ for 30 minutes. After electrolysis, only the central channel was copper-plated, the remainder of the sample (which had not been preliminarily cleaned) remained completely insulating.

EXAMPLE 4

50 parts by weight of cuprous oxide, having a particle size distribution ranging from 0.5 to 3 $\mu m$, were added to 100 parts by weight of an epoxy resin of the epichlorhydrin/bisphenol A type, marketed by the Ciba company under the trademark ARALDITE D ®. The mixture was homogenized by mechanical stirring. 20 parts by weight of hardener, marketed by the Ciba company under the trademark HY 951 ®, were then added to the resultant viscous paste. The entire mass was homogenized once more and cast into a mold having the dimensions 50×50×50 mm.

After 10 hours at ambient temperature (20° C.), the mass had completely gelled. Cross-linking was then effected in an oven at 50° C. for 5 hours.

After removal from the mold, the piece obtained was surface-cleaned by sandblasting with a siliceous sand passing through an 0.1 mm mesh sieve; it was then ultrasonically rinsed in a water tank, and was then dipped for 15 minutes into the borohydride solution in accordance with Example 3. The surface resistivity obtained was on the order of several tens of $\Omega/\square$.

After the reduction treatment, the test piece was immersed in a standard electrochemical nickel-plating bath, reduced with hypophosphite: nickel sulfate concentration: 30 g/liter; hypophosphite concentration: 10 g/liter; pH: about 4.5; temperature: 60° C. An uniform coat of nickel of about 4 μm thickness and having excellent adhesion was thus deposited after 4 hours of metallization.

EXAMPLE 5

Continuous threads of 30 decitex were produced in a manner known per se from an uniform mixture comprising 70% by weight of polyhexamethylene adipamide and 30% by weight of cuprous oxide, having a particle size distribution of about 0.2 μm.

A cord formed from these continuous threads was placed in an aqueous solution containing 5% by weight of sodium borohydride for 30 minutes. After rinsing and drying, one of the threads from which the cord was made was taken therefrom and it was determined that same had an ohmic resistance of $5.3 \times 10^4$ Ω/cm.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. A process for metallization of a plastic substrate including
   (i) providing a plastic shaped article comprising intimate admixture of a polymeric resin and a plurality of small filler particles of cuprous oxide uniformly dispersed therethrough,
   (ii) subjecting at least one of the face surfaces of said plastic shaped article to the action of a reducing agent comprising a borohydride to convert the cuprous oxide filler particles to conductive free metal, the metallization growth nuclei thereby obtained having a surface resistivity ranging from about 0.01 Ω/□ to about $10^3$ Ω/□ and thence electrolessly and/or electrolytically metallizing the at least one reduced face surface of said plastic shaped article with a free metal deposit.

2. The process as defined by claim 1, said plastic shaped article to be metallized comprising from 25 to 90% by weight of the cuprous oxide filler particles, from 0 to 50% by weight of another filler, and from 10 to 75% by weight of the polymeric resin.

3. The process as defined by claim 2, the polymeric resin comprising said plastic shaped article being a thermoplastic resin, thermoset resin, elastomer, or admixture thereof.

4. The process as defined in claim 3, said cuprous oxide filler particles having a particle size distribution ranging from 0.1 to 5 μm.

5. The process as defined by claim 3, the polymeric resin comprising a polyolefin, vinyl, polystyrene, polyamide, acrylic, polyurethane, or saturated polyester thermoplastic resin.

6. The process as defined by claim 3, the polymeric resin comprising a hardened phenolic, unsaturated polyester, epoxy or polyimide prepolymer.

7. The process as defined by claim 3, the polymeric resin comprising an elastomer.

8. The process as defined by claim 3, said reducing agent comprising an unsubstituted alkali metal borohydride or a substituted borohydride wherein up to three of the hydrogen atoms which comprise the borohydride ion have been replaced by inert substituents.

9. The process as defined by claim 8, said reducing agent comprising an aqueous or aqueous/inert polar solvent solution of the borohydride, the concentration of which, expressed as a percentage by weight of the active hydrogen of the borohydride in solution, ranging from 0.05 to 1%.

10. The process as defined by claim 3, said metallizing being electrolytic.

11. The process as defined by claim 3, the free metal deposited in the metallizing step having a thickness of at least about 20 μm.

12. The process as defined by claim 3 wherein the action of said reducing agent extends from the at least one face surface to within the body of said plastic shaped article.

13. The process as defined by claim 3 wherein the action of said reducing agent extends completely through said plastic shaped article.

14. The process as defined by claim 3, said small filler particles of cuprous oxide having been exposed by face surface cleaning operation.

15. The process as defined by claim 3, said free metal deposited in the metallizing step comprising nickel, cobalt, chromium copper, iron, silver, gold, vanadium, cobalt/nickel alloy or brass.

16. The product of the process as defined by claim 1.

* * * * *